United States Patent [19]

Groves et al.

[11] E Re. 29,845

[45] Reissued Nov. 21, 1978

[54] $GaAs_{1-x}P_x$ ELECTROLUMINESCENT DEVICE DOPED WITH ISOELECTRONIC IMPURITIES

[75] Inventors: Warren O. Groves; Arno H. Herzog; Magnus G. Craford, all of St. Louis County, Mo.

[73] Assignee: Monsanto Company, St. Louis, Mo.

[21] Appl. No.: 775,070

[22] Filed: Mar. 7, 1977

Related U.S. Patent Documents

Reissue of:

[64] Patent No.: 3,725,749
Issued: Apr. 3, 1973
Appl. No.: 158,312
Filed: Jun. 30, 1971

[51] Int. Cl.[2] ..... H01L 33/00

[52] U.S. Cl. ..... 357/17; 357/61; 357/16

[58] Field of Search ..... 357/17, 18, 61, 16

[56] References Cited

U.S. PATENT DOCUMENTS

| | | | |
|---|---|---|---|
| 3,462,320 | 8/1969 | Lynch | 148/171 |
| 3,560,275 | 2/1971 | Kressel | 148/171 |
| 3,603,833 | 9/1971 | Logan | 313/108 D |
| 3,617,820 | 1/1971 | Herzog | 317/234 |
| 3,634,872 | 1/1972 | Umeda | 317/234 R |
| 3,646,406 | 2/1972 | Logan | 317/234 R |
| 3,687,744 | 8/1972 | Ogirama | 148/175 |
| 3,873,382 | 3/1975 | Groves | 148/175 |

OTHER PUBLICATIONS

Logan et al., *J. Appl. Phys.*, vol. 42, No. 6, May 1971, pp. 2328–2335.

*Primary Examiner*—Martin H. Edlow
*Attorney, Agent, or Firm*—Henry Croskell

[57] ABSTRACT

The disclosure herein pertains to the preparation of semiconductor materials and solid-state devices fabricated therefrom. More particularly, the disclosure pertains to a vapor phase process for the preparation of electroluminescent materials, particularly $GaAs_{1-x}P_x$, doped with isoelectronic impurities, particularly nitrogen, and to electroluminescent devices fabricated therefrom.

17 Claims, 12 Drawing Figures

$GaAs_{1-x}P_x$ ELECTROLUMINESCENT DEVICE DOPED WITH ISOELECTRONIC IMPURITIES

Matter enclosed in heavy brackets [ ] appears in the original patent but forms no part of this reissue specification; matter printed in italics indicates the additions made by reissue.

BACKGROUND OF THE INVENTION

This invention pertains to the field of semiconductor material preparation and device fabrication. In preferred embodiments, the invention pertains to the field of electroluminescent materials and devices.

As pertinent to this invention, it is known in the prior art that nitrogen may be introduced into gallium phosphide (GaP) to create isoelectronic traps which function as radiative recombination centers for enhancement of the emission of green light when fabricated into junction devices. The prior art processes specifically designed for introducing nitrogen into the GaP, whether used as substrate or as an epitaxial film or both in the fabricated device, has been limited, apparently, to solution growth or liquid phase epitaxial processes. Typical of these prior art processes is that described, for example, in U.S. Pat. No. 3,462,320, where electroluminescent GaP devices are prepared by adding gallium nitride (GaN) and polycrystalline GaP containing a dopant of one conductivity type to a melt of elemental gallium (Ga) and heated to 1,200° C in a sealed quartz ampoule, followed by cooling to 800° C over a period of about 10 hours. The irregularly-shaped single crystals of nitrogen-doped GaP formed in the process is extracted from the gallium by washing in concentrated HCl, cut to size and shape and polished. The product thus formed is used as a substrate onto which an epitaxial layer of GaP of different conductivity type is grown by the liquid phase technique known as tipping. Contacts are affixed to the P and N regions to fabricate a two-terminal P-N junction device.

In other prior art processes a nitrogen-doped GaP epitaxial film is grown by liquid phase epitaxial deposition, e.g., by tipping, onto a substrate of GaP of opposite conductivity type to that in the epitaxial film; the GaP substrate may or may not be further doped with nitrogen.

It is also known to prepare electroluminescent GaP diodes by vapor phase processes. However, there seems to be no disclosure in the prior art specifically teaching the intentional doping of GaP with nitrogen in vapor phase processes to produce electroluminescent materials suitable for light-emitting diodes. In one known process, sulfur-doped GaP was epitaxially deposited from the vapor phase onto a gallium arsenide (GaAs) substrate by a phosphorus trichloride ($PCl_3$) transport process. In that process, purified hydrogen carrying the $PCl_3$ was combined with a stream of hydrogen carrying the sulfur impurity and the gaseous mixture introduced into a quartz reactor tube to react with Ga at 930° C and form GaP which was epitaxially deposited onto the GaAs substrate. Thereafter, a P-type dopant, e.g., zinc or beryllium, was diffused into the N-type GaP layer to form a P-N junction. The emission spectra for diodes fabricated from the epitaxial GaP/GaAs structure showed, inter alia, that isolated atoms of nitrogen were present as an unintentionally added impurity; no comment is offered as to either the possible source of nitrogen addition or its location within the device material, i.e., whether in the P or N regions of the GaP. The process referred to is described in more detail by E. G. Dierschke et al. in the Journal of Applied Physics, Vol. 41, No. 1, pages 321–328, Jan., 1970.

The prior art relative to the incorporation of isoelectronic impurities into semiconductor materials does not appear to contain any positive disclosure relevant to the fabrication of electroluminescent devices from alloys (mixed crystals or solid solutions) of binary III–V compounds, such as gallium arsenide phosphide, $GaAs_{1-x}Px$, where x has a value greater than ~0.2 and less than one, produced in any manner.

In the Dierschke et al. article referred to above, reference is made to contamination of the epitaxial GaP layer with arsenic atoms, derived from the GaAs substrate, resulting in a composition of $GaAs_xP_{1-x}$, in which the mole fraction of arsenic, in the most representative curve for crystals grown under normal conditions, had a maximum value of 0.06 at the GaP/GaAs interface, decreasing with distance therefrom to a value of less than 0.02 at a distance of 1.0 mm. As noted above, the arsenic was introduced, unintentionally, into the epitaxial GaP from the GaAs substrate; the presence of arsenic in the GaP layer was unknown to the authors prior to an analysis of the emission spectra and verification by electron probe measurements. As further noted above, the Dierschke et al. article does not indicate whether the isolated atoms of nitrogen shown to be present by emission spectra, were present in the N-type or P-type GaP; in any event, the nitrogen, like the arsenic, was unintentionally added.

In a process described by P. J. Dean et al. in Applied Physics Letters, Vol. 14, No. 7, pages 210–212, Apr. 1, 1969, phosphorus-rich $GaAs_xP_{1-x}$ (where $x \lesssim 0.2$) doped with nitrogen was grown from the vapor by introducing phosphine ($PH_3$) and arsine ($AsH_3$) in a stream of wet hydrogen into an open tube reactor heated to about 1,040° C wherein the water reacted with sintered boron nitride (BN) to generate $NH_3$ above the crystal growth zone; nitrogen from the $NH_3$ was used to dope the $GaAs_xP_{1-x}$ apparently uniformly throughout the growing crystal. However, the article published by Dean et al., supra, was directed primarily to a discussion of the localization energy of excitons et isoelectronic nitrogen sites in phosphorus-rich $GaAs_xP_{1-x}$ based on experimental results from optical absorption spectra for $x \lesssim 0.2$. No disclosure is made in the Dean et al. article pertaining to the fabrication of electroluminescent gallium arsenide phosphide P-N junction devices or performance characteristics thereof.

In the prior art processes referred to above the isoelectronic impurity, nitrogen, is usually distributed uniformly throughout the epitaxial film and/or substrate upon which the film is deposited. Since the electroluminescence from isoelectronic nitrogen sites occurs within the vincinity of the P-N junction space charge region, nitrogen atoms in the remaining portions of the material absorb part of the emitted radiation. In order to obtain the desired nitrogen profile, it has been suggested that a liquid phase epitaxial double tipping technique be employed. In such proposed method, during the first tipping operation to grow a layer of one conductivity type, the epitaxial growth cooling cycle is interrupted after growth of a layer having a given nitrogen concentration, and the nitrogen content increased by adjusting the $NH_3$ concentration to increase the GaN concentration in the Ga growth solution. On resuming the cooling cycle the subsequent layer growth would have the desired higher nitrogen concentration. Next, a layer of opposite conductivity type is grown by a second tipping operation from a melt conaining the desired GaN level. After a desired growth period, the cooling cycle is interrupted and GaN evaporated from the Ga growth melt. Upon resuming the cooling cycle, the remaining layer is grown with a low nitrogen level.

Therefore, it is an object of this invention to provide a vapor phase process for the preparation of nitrogen-doped $GaAs_{1-x}P_x$ electroluminescent materials.

It is a further object of this invention to provide a simple means for introducing nitrogen into a specified region of the epitaxial layer of $GaAs_{1-x}P_x$.

A further object of the invention is to provide a new composition of matter particularly suitable for use in the fabrication of electroluminescent devices.

Another object of this invention is to provide improved electroluminescent devices fabricated from the nitrogen-doped $GaAs_{1-x}P_x$ produced herein.

These and other objects will become apparent from the detailed description of the invention given below.

SUMMARY OF THE INVENTION

This invention pertains to a vapor phase process for the introduction of isoelectronic impurities into the junction region only of semiconductor materials and to semiconductor devices prepared therefrom. In preferred embodiments, the invention pertains to the introduction of nitrogen into a specified region of $GaAs_{1-x}BTx$ material which is subsequently fabricated into electroluminescent devices.

$GaAs_{1-x}P_x$ is prepared by reacting a hydrogen halide in hydrogen with Ga and combining the reaction mixture with hydrogen carrying $PH_3$, $AsH_3$ and an impurity dopant of one conductivity type to form $GaAs_{1-x}P_x$ which is deposited from the vapor phase onto a suitable substrate as an epitaxial film. The composition of the grown film is controlled to produce a graded region having controlled ratios of arsenic-to-phosphorus in contact with the substrate and varying in the growing layer until the desired arsenic-to-phosphorus ratio is achieved. When the desired arsenic-to-phosphorus ratio has been established, nitrogen is introduced into the reactant vapor stream and incorporated into the growing epitaxial layer only in the narrow region where the P-N junction is to be formed and radiation generated. Thereafter, the P-N junction is formed by either introducing into the reactant vapors an impurity of conductivity type opposite to that previously used or by diffusing an opposite-type impurity into the epitaxial layer after growth has been terminated.

The nitrogen-doped $GaAs_{1-x}P_x$ epitaxial structure is then fabricated into electroluminescent devices by conventional techniques. By varying the arsenic-to-phosphorus ratios in $GaAs_{1-x}P_x$ composition, light-emitting diodes may be fabricated to emit light of improved brightness and efficiency in colors ranging from red through green.

DESCRIPTION OF PREFERRED EMBODIMENTS

EXAMPLE 1

In preferred embodiments, the process and apparatus used in carrying out the present invention is generally similar to that disclosed in U.S. Pat. No. 3,218,205 to R. A. Ruehrwein, assigned to same assignee herein.

In this example, reference will be made to the preparation of the epitaxially-structured material used to fabricate the device shown sectionally in FIG. 1E.

Figure 1A:
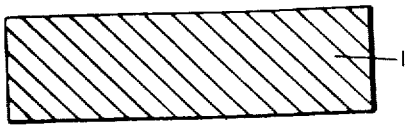
In FIGS. 1A–1E are shown sequential steps in the preparation of semiconductor materials according to this invention.
Figure 1B:
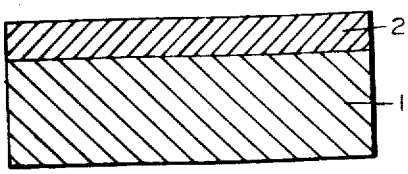
Figure 1C:
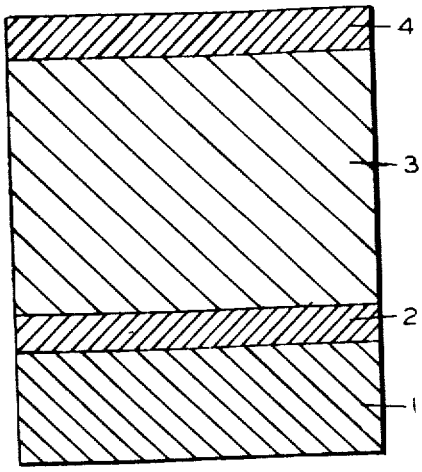

In the epitaxial growth operation shown in FIGS. 1A–1C, a cleaned and polished substrate wafer of single crystal GaP oriented 5° off the (100) crystallographic plane was placed in a fused silica reactor tube located in a furnace. The reactor tube was flushed with hydrogen to remove oxygen from the tube and surface of the substrate. The reactant vapor was produced by introducing a stream of HCl at 3.5 cc/min. into a stream of hydrogen at 50 cc/min. and passing this stream over elemental Ga at 770° C. Simultaneously, a second hydrogen stream at 450 cc/min., into which is introduced 0.29 cc/min. of $AsH_3$, 0.88 cc/min. of $PH_3$ and about 0.3 cc/min. of a 100 ppm diethyl telluride in hydrogen mixture, is made up and combined with the HCl-Ga reaction mixture in the reaction zone of the reactor tube heated to 925° C. From the reaction zone the vapors moved to a cooler region of the tube heated to 825° C where epitaxial deposition of $GaAs_{1-x}P_x$ was initiated on the GaP substrate. In order to minimize strain and crystal imperfections due to lattice mismatch, an initial layer of GaP about 12μm thick is epitaxially deposited onto the GaP substrate. Then by adjusting the relative proportions of $PH_3$ and $AsH_3$ in the reactant feed stream, a continuously graded composition layer 2 is grown about 8μm thick to a final composition corresponding to the formula $GaAs_{0.235}P_{0.765}$ and epitaxial deposition of this composition is continued to grow a layer 3 about 330μm thick. During the final period of epitaxial growth. 300 cc/min. of a 10% $NH_3$ in hydrogen mixture was substituted for 300 cc/min. of $H_2$ to grow a nitrogen-doped epitaxial layer 4 about 18μm thick, after which growth was terminated and the system cooled to ambient. The structure at this stage is as shown in FIG. 1C.

Figure 1D:
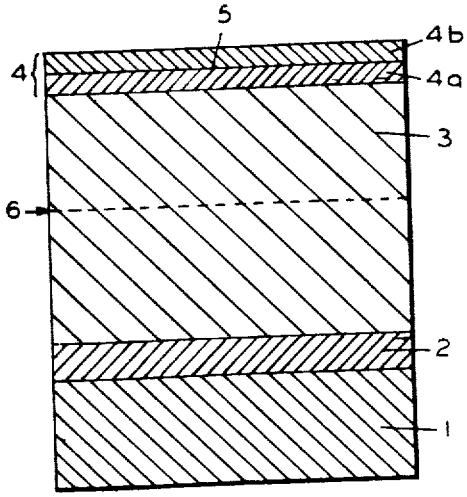
Figure 1E:
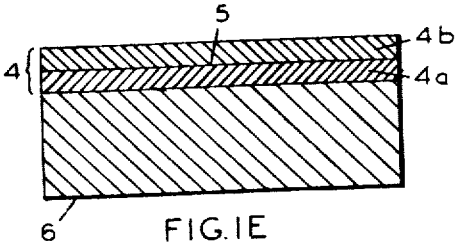

A sample of the material prepared as above was then diffused for 20 min. at 875° C in an evacuated and sealed ampoule containing 3 mg. of Zn and 3 mg. of phosphorus, to produce a P-region 4b and P-N junction 5 about 6μm deep in the nitrogen doped layer as shown in FIG. 1D. The entire epitaxial layer, including regions 2, 3, 4a and 4b, was doped with tellurium to a net donor concentration of about $3 \times 10^{16}$ $cm^{-3}$.

Figure 1F:
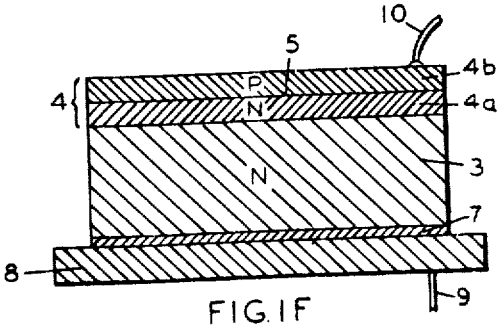
In FIGS. 1F and 1G are shown cross-sectional schematic views of typical embodiments of semiconductor devices fabricated accoding to this invention.
Figure 1G:
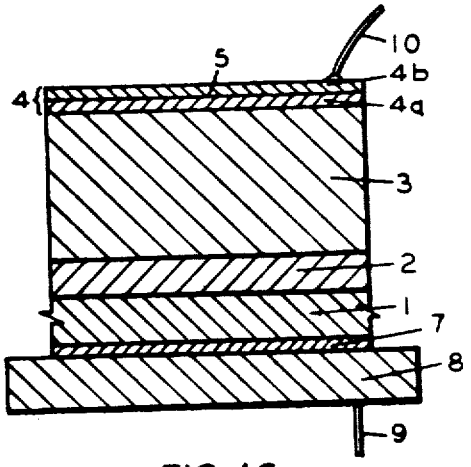

The material produced in the above process was then fabricated into devices. The finished wafer was lapped from the substrate side to a thickness of about 5 mils. Because of the thickness of layer 3 this resulted in the removal of substrate 1, layer 2 and a portion of layer 3 up to a level represented by dashed line 6 in FIG. 1D to produce the wafer shown in FIG. 1E. For epitaxial structures having a total thickness for layers 2 through 4b (FIG. 1D) of less than about 5 mils, the device would appear as in FIG. 1G. Ohmic contact was made to the N-type surface 6 (FIG. 1E) by vacuum evaporating a layer 7 (FIGS. 1F and 1G) of Au/Ge (12 percent) alloy onto the surface and bonding the latter to a suitable header 8, such as a TO-18 header, having negative terminal post 9 (positive terminal not shown). Ohmic contact was then made to the P-surface of the device by attaching thereto a gold wire 10 by ultrasonic bonding.

Figure 6:
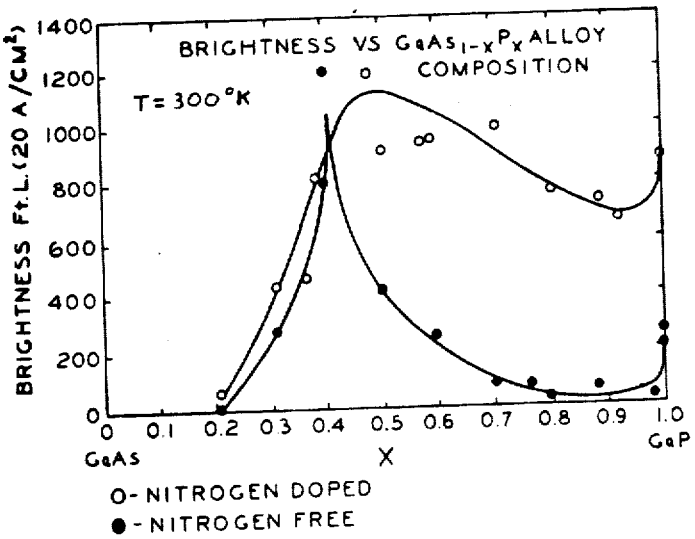

Electroluminescent diodes fabricated with material of the composition produced in accordance with this embodiment of the invention produced an average brightness of about 830 foot-Lamberts at a current density of 20 A/cm$^2$ at a wavelength of 6,040 A as shown by reference to the upper curve in FIG. 6, which shows comparative curves for brightness vs. alloy composition for nitrogen-doped and nitrogen-free diodes measured at room temperature.

By way of comparison, a second sample of the identical material produced as above was processed to remove the nitrogen-doped layer (region 4 in FIG. 1C) prior to diffusion of the Zn dopant under the same conditions described above for diffusing Zn into the nitrogen-doped layer to produce the P-N junction. The average brightness of a batch of ten diodes fabricated from the nitrogen-free material 58 only 58 foot-Lamberts at a current density of 20 A/cm$^2$ at 5,800 A as shown by reference to the solid curve in FIG. 6 for nitrogen-free diodes.

EXAMPLES 2

This example exemplifies an embodiment of the invention wherein a GaAs substrate is used and the P-N junction is formed by using zinc arsenide ($ZnAs_2$) as the diffusant.

The process operation here follows that described in the preceding example, again having reference to the steps and structure shown in FIGS. 1A-F. The reactant gas was produced by passing 5.4 cc/min. of HCl in 50 cc/min. of $H_2$ over elemental Ga at 780° C and combining the resultant mixture with 450 cc/min. of $H_2$ containing 2.6 cc/min. of $AsH_3$ and 1.4 cc/min. of $PH_3$ at a reaction temperature of about 925° C. About 0.4 cc/min. of a 100 ppm diethyl telluride mixture in $H_2$ was added to the main $H_2$ stream to produce a net donor concentration of about $6 \times 10^{16}$ cm$^{-3}$. The reaction mixture then contacted a single crystal GaAs substrate 1 oriented within 2° of the (100) plane at a deposition temperature of 840° C. By adjusting the relative concentration of $PH_3$ and $AsH_3$ in the vapor phase, a graded composition layer 2 was grown on the substrate to a thickness of about 65μm, at which level the alloy composition was $GaAs_{0.525}P_{0.475}$, An epitaxial layer 3 of this composition was then grown to a thickness of about 192 μm. During the final minutes of the growth period, 300 cm/min. of a 10% $NH_3$-in-$H_2$ mixture was substituted for 300 cc/min. of $H_2$ to produce a nitrogen-doped surface layer (region 4 prior to diffusion) about 12 μm thick.

Material of the above composition was then fabricated into diodes by diffusion with 8 mg. of $ZnAs_2$ of 800° C for 45 minutes in an evacuated and sealed ampoule to form a P-region 4b and P-N junction 5 about 5μm below the surface. After lapping to a thickness of about 5 mils and attaching ohmic contacts and leads as before, a series of light-emitting diodes (LED's) thus fabricated produced an average brightness of about 1,100 foot-Lamberts at a current density of 20 A/cm$^2$ as shown on the upper (nitrogen-doped) curve in FIG. 6. By way of comparison, a second series of LED's fabricated from the same alloy composition, except for removal of the nitrogen-doped layer (region 4 in FIG. 1C) and a re-diffusion with $ZnAs_2$ in the manner described in Example 1, produced an average brightness of only 490 foot-Lamberts.

At a reduced current density of 10 A/cm$^2$, nitrogen-doped LED's fabricated from the alloys composition of this example, produced an average brightness of 470 foot-Lamberts at a wavelength of 6,650 A, which is of the same order magnitude of brightness produced by the non-nitrogen-doped LED's at 20 A/cm$^2$. This performance is an order of magnitude better than that typically obtained for this alloy composition (which is in the indirect energy bandgap region) and is comparable in brightness to that of red-emitting LED's from non-nitrogen-doped alloys of the composition $GaAs_{0.64}P_{0.36}$, which is in the direct energy bandgap region. Thus, with the addition of nitrogen according to this invention, LED's of generally equivalent brightness can be fabricated throughout the spectral range from 6,500 A to 5,600 A. This is particularly important in the yellow portion of the spectrum, because high brightness yellow-emitting LED's have not been available heretofore.

Figure 2:
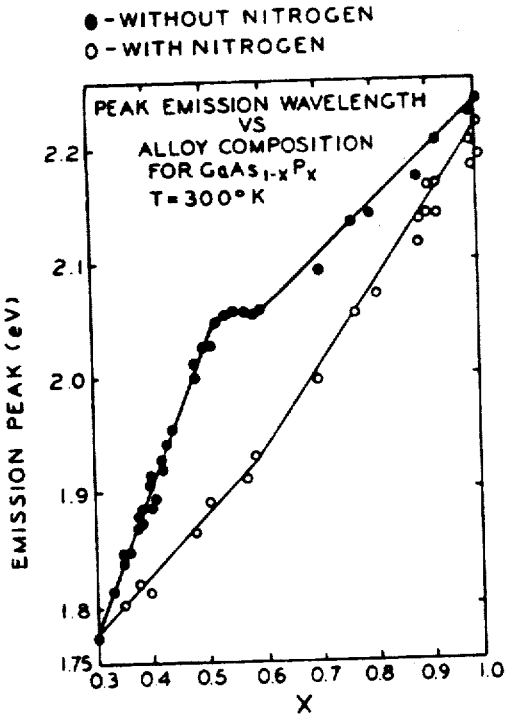
In FIGS. 2–6 are shown comparative curves for various performance and device characteristics for $GaAs_{1-x}BTx$ devices with and without nitrogen addition.
Figure 3:
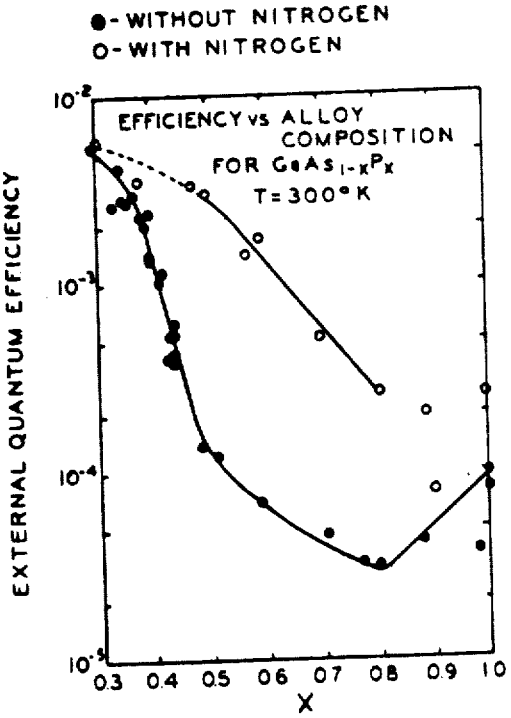
Figure 4:
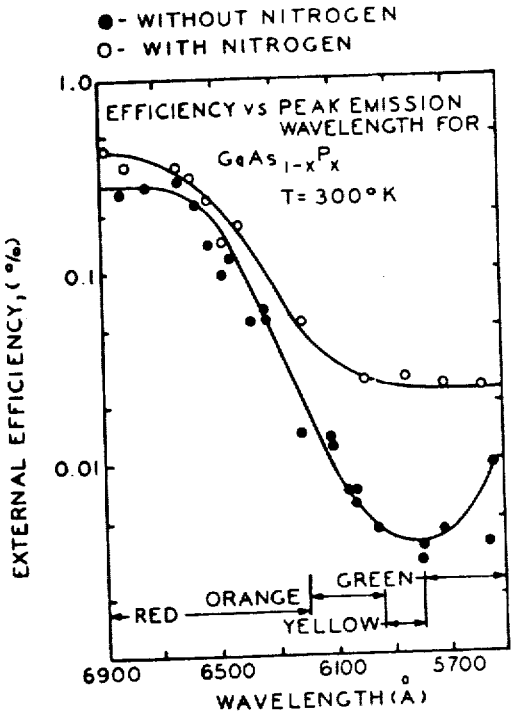

The improved efficiency performance of the nitrogen-doped electroluminescent devices of this invention, as compared with nitrogen-free devices is shown by reference to FIGS. 2–4. The external quantum efficiencies referred to herein were obtained using epoxy-encapsulated diodes (epoxy lens not shown in FIG. 1) which were mounted on TO-18 headers using Au/Ge preforms.

Referring to FIG. 2, it will be noted that the addition of nitrogen causes a shift in the peak emission energy (eV) hence, wavelength, for a given $GaAs_{1-x}P_x$ composition. To convert from wavelength in Angstom units (A) to peak emission energy, in electron volts (eV), the wavelength value is divided into the conversion factor 1,2395, thus eV = 12395/γ(A). The separation between emission peaks in nitrogen-doped and nitrogen-free LED's changes as a function of alloy composition. It will be noted that the separation between the peak emission energies of the nitrogen-doped and undoped LED's increases with decreasing x, reaching a maximum separation of about 0.15 eV in the region of $0.5 < \lambda \times < 0.6$. The peak position and band width changes with current density and the nature and degree off the change is dependent upon the alloy composition and temperature. The peak emission energies plotted in FIG. 2 were obtained at a relatively low injection current density of 10 A/cm$^2$.

In FIG. 3, the external quantum efficiency is plotted as a function of the $GaAs_{1-x}P_x$ composition. The efficiency of the LED's increases with decreasing x. This increase in efficiency is believed to be due largely to two factors. First, the increasing depth of the nitrogen center results in increased thermal stability of the trapped exciton. Second, the fact that the separation between the (100) and (000) minima is decreasing with decreasing x is expected to give rise to an increase in the transition probability for the A-line emission.

In FIG. 4 are shown curves for nitrogen-doped and nitrogen-free LED's with external efficiencies plotted against peak emission wavelengths for various alloys compositions. It will be seen that the efficiencies for the nitrogen-doped LED's is greater than those of nitrogen-free LED's throughout the spectrum shown on the graph. The greatest separation between the curves, representing the greatest improvement in external efficiencies of the nitrogen-doped over the nitrogen-free LED's, is generally in the yellow region of the spectrum.

Figure 5:
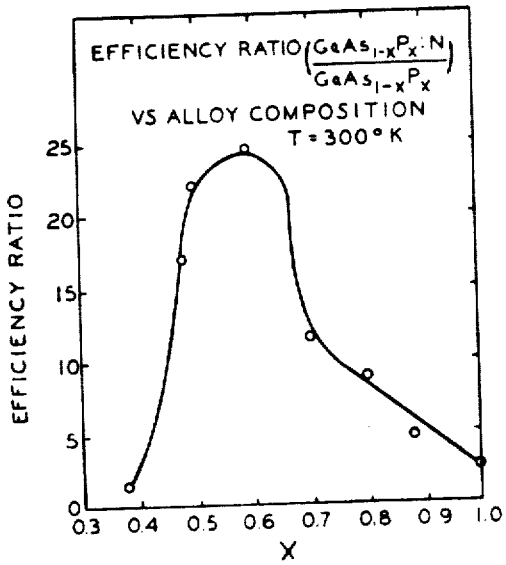

Referring to FIG. 3 it will be noted that for the alloy composition region $0.5 < x < 0.6$, the efficiency of the nitrogen-doped LED's is more than 20 times greater than that for the nitrogen-free LED's. Another way to express this increased efficiency is shown in FIG. 5 wherein the efficiency ratio, $GaAs_{1-x}P:N/GaAs_{1-x}P_x$, of nitrogen-doped to nitrogen-free LED's is plotted against alloy composition.

Although the quantum efficiency of the nitrogen-doped diodes is a strong function of alloy composition, the luminous efficiency and brightness are nearly independent of alloy composition in the region $x<0.4$. The reason for this is that the sensitivity of the human eye decreases sharply as x decreases and the color changes from green through yellow to red. Typical brightness performance obtained with and without nitrogen doping are shown in FIG. 6 wherein brightness is plotted as a function of alloy composition.

In preferred embodiments of the invention, referring now to FIGS. 1B–1D, the graded alloy composition, layer 2, can be from 1 to 300μm or more, although best results to date are obtained with layers on the order of about 25 μm. The region 3 of constant alloy composition is preferably about 100μm thick, but can have thicknesses within the range 0–300μm or more. The N-type region 4a of the nitrogen-doped surface layer preferably should be about 5μm, but more broadly, can have thicknesses within the range 0–300μm or more. The P-type region 4b of the nitrogen-doped layer preferably should be about 5–10μm thick and, more broadly can be from 1 to 25μm or slightly more. Thus, it will be noted that in some embodiments, either one or both of the constant composition alloy layer 3 and/or nitrogen-doped layer 4a can be omitted rom the epitaxial $GaAs_{1-x}P_x$ structures and LED's of this invention. However, in preferred embodiments as exemplified in the above examples, the epitaxial $GaAs_{1-x}P_x$ shown structure is as shown FIG. 1F, with layers 1 and 2 removed by lapping.

The conductivity type determining impurity used in doping the epitaxial film may be introduced initially into the region 2 of graded composition and continuously added throughout the remainder of the growth period, or the impurity may be first introduced at the beginning of growth of the constant composition layer 3. In preferred embodiments, the epitaxial film is doped with N-type impurities and diffused with P-type impurities to form the P-N junction. Suitable impurities include those conventionally used in the art, e.g., S. Se, Te or Si for N-type doping and Be, Zn or Cd for P-type doping. The N-type impurity concentration range is broadly, from about $2.0 \times 10^{16} - 2.0 \times 10^{17}$ $cm^{-3}$ and, preferably about $7.0 \times 10^{16} cm^{-3}$. The surface concentration of P-type impurities is typically on the order of $10^{19}$ atoms/$cm^3$.

With respect to the nitrogen dopant, as indicated above, in preferred embodiments, the nitrogen is selectively introduced into the growing epitaxial film only in the region in which the P-N junction is to be formed, typically in the upper 5–20μm surface region (layer 4 in FIG. 1C). The nitrogen concentration in this surface region is typically about $1 \times 10^{18} - 1 \times 10^{19}$ atoms/$cm^2$. However in less preferred embodiments of the invention, the entire epitaxial film (layers 2–4b) may be doped with nitrogen, but in much lower concentrations below layer 4a. The isoelectronic impurity may be introduced from any suitable source, e.g., elemental nitrogen, gaseous or volatile compounds thereof.

The graded composition alloy layer 2 may be either linearly or non-linearly graded, but in preferred embodiments is linearly graded from the composition of the GaAs or GaP substrate to the desired final composition.

The electroluminescent devices of this invention may be fabricated as discrete LED's or as arrays thereof by conventional photolithographic techniques.

The nitroge-doped $GaAs_{1-x}P_x$ alloy compositions of the present invention are particularly suitable for use in the fabrication of LED's in the visible portion of the spectrum. Although visible light is generated in materials within the range $x>0.2$ to $<1.0$ a preferred range for the LED's of the invention is where x is between about 0.3 and 0.9. For red light-emitting LED's, x preferably is between 0.4 and 0.6, and for yellow LED's x is between 0.6 and 0.9.

With further respect to the LED's of this invention, the presence of initial layers (1 and 2 in FIG. 1) essential in producing the desired material is not essential to the operation of the final device and they may be removed in reducing the thickness of the semiconductor chip to a convenient value of 100 to 150μm. In the embodiment using GaAs as a substrate it is desirable to remove the substrate 1 and the region of graded composition 2 to minimize absorption losses and gain radiation reflected from layer 7.

Various modifications may be made in the present invention without departing from the spirit and scope thereof. For example, still other modifications within the purview of this invention include the use of other substrates whose lattice structure is compatible with epitaxial growth of the $GaAs_{1-x}P_x$ film, e.g., Ge, Si, etc. It is also contemplated that other alloy systems are also amenable to doping with nitrogen and other isoelectronic impurities in the manner of this invention for fabrication into electroluminescent devices.

It is also contemplated that vapor epitaxial deposition processes other than those specifically used in the working examples above may be employed for this invention.

We claim:

1. An article of manufacture comprising an electroluminescent *vapor-grown epitaxial* material having the formula $GaAs_{1-x}P_x$, wherein x has a value within the range of [$>0.2$ and $>1.0$] *0.4 to 0.9*, containing impurity atoms of a first conductivity type and a surface region thereof containing isoelectronic impurity atoms and impurity atoms of conductivity type opposite to that of said first type to define a P-N junction in said material *and means for making ohmic contact to opposite sides of said P-N junction.*

2. Article according to claim 1 wherein said isoelectronic impurity atoms are nitrogen atoms.

[3. Article according to claim 1 wherein x has a value within the range of 0.3 to $<1.0$.]

4. Article according to claim 1 wherein x has a constant value throughout said material.

5. Article according to claim 1 wherein x has a value which continuously changes with distance from the lower surface to the upper surface of said material.

6. Article according to claim 4 having an additional region extending below and contiguous with the lower surface of said material, wherein the value of x continuously changes with distance from said lower surface.

7. Article according to claim 6 wherein said material is in epitaxial relationship with a suitable substrate.

8. Article according to claim 7 wherein said substrate is GaP.

9. Article according to claim 7 wherein said substrate is GaAs.

[10. Article according to claim 4 further including ohmic contacts and leads to an external circuit attached to surfaces of opposite conductivity type of said material.]

[11. Article according to claim 5 further including ohmic contacts and leads to an external circuit attached to surfaces of opposite conductivity type of said material.]

[12. Article according to claim 8 further including ohmic contacts and leads to an external circuit attached to surfaces of opposite conductivity of said material.]

[13. Article according to claim 9 further including ohmic contacts and leads to an external circuit attached to surfaces of opposite conductivity type of said material.]

14. Article according to claim 1 wherein said impurity atoms of first conductivity type are of N-type conductivity.

15. Article according to claim 1 wherein said isoelectronic atoms are present through said material.

16. Article according to claim 15 wherein said impurity atoms of first conductivity type are of P-type conductivity.

*17. Article according to claim 1 wherein said electroluminescent material produces an average brightness of at least 600 foot-Lamberts at a current density of 20 amperes/square centimeter over the entire range of said x values from 0.4 to 0.9.*

*18. Article according to claim 1 wherein said isoelectronic impurity atoms are present only in the region of said P-N junction.*

*19. An article of manufacture comprising an electroluminescent vapor-grown epitaxial material having the formula $GaAs_{1-x}P_x$ wherein x has a value within the range of 0.4 to 0.6, containing impurity atoms of a first conductivity type and a surface region thereof containing isoelectronic impurity atoms of a conductivity type opposite to that of said first type to define a P-N junction in said material and means for making ohmic contact to opposite sides of said P-N junction, said electroluminescent material being red light-emitting and producing an average brightness of at least 600 foot-Lamberts at a current density of 20 amperes/square centimeter over the entire range of said x values from 0.4 to 0.6.*

*20. An article of manufacture comprising an electroluminescent vapor-grown epitaxial material having the formula $GaAs_{1-x}P_x$ wherein x has a value within the range of 0.6 to 0.9, containing impurity atoms of a first conductivity type and a surface region thereof containing isoelectronic impurity atoms of a conductivity type opposite to that of said first type to define a P-N junction in said material and means for making ohmic contact to opposite sides of said P-N junction, said electroluminescent material being yellow light-emitting and producing an average brightness of at least 600 foot-Lamberts at a current density of 20 amperes/square centimeter over the entire range of said x values from 0.6 to 0.9.*

*21. An article of manufacture comprising an electroluminescent vapor-grown epitaxial material having the formula $GaAs_{1-x}P_x$ wherein x has a value within the range of 0.4 to about 0.9), containing impurity atoms of a first conductivity type and a surface region thereof containing isoelectronic impurity atoms of a conductivity type opposite to that of said first type to define a P-N junction in said material and means for making ohmic contact to opposite sides of said P-N junction, said electroluminescent material being yellow or orange light-emitting and producing an average brightness of at least 600 foot-Lamberts at a current density of 20 amperes/square centimeter over the entire range of said x values from 0.4 to about 0.92.*

*22. An article of manufacture comprising an electroluminescent vapor-grown epitaxial material having the formula $GaAs_{1-x}P_x$ wherein x has a value within the range of 0.6 to about 0.92 containing impurity atoms of a first conductivity type and a surface region thereof containing isoelectronic impurity atoms of a conductivity type opposite to that of said first type to define a P-N junction in said material and means for making ohmic contact to opposite sides of said P-N junction, said electroluminescent material being yellow light-emitting and producing an average brightness of at least 600 foot-Lamberts at a current density of 20 amperes/square centimeter over the entire range of said x values from 0.6 to about 0.92.*

* * * * *